(12) United States Patent
Lee et al.

(10) Patent No.: US 7,321,184 B2
(45) Date of Patent: Jan. 22, 2008

(54) RAKE SHAPED FAN

(75) Inventors: Seri Lee, Beaverton, OR (US); Ioan Sauciuc, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 184 days.

(21) Appl. No.: 11/200,675

(22) Filed: Aug. 9, 2005

(65) Prior Publication Data

US 2007/0037506 A1    Feb. 15, 2007

(51) Int. Cl.
*H01L 41/08* (2006.01)
(52) U.S. Cl. ............. 310/341; 310/328; 310/330
(58) Field of Classification Search ........ 310/311, 310/328, 330–333, 341
See application file for complete search history.

(56) References Cited

U.S. PATENT DOCUMENTS

| | | | | |
|---|---|---|---|---|
| 4,387,318 A | * | 6/1983 | Kolm et al. | 310/330 |
| 4,498,851 A | * | 2/1985 | Kolm et al. | 417/410.2 |
| 4,595,338 A | * | 6/1986 | Kolm et al. | 416/81 |
| 4,780,062 A | * | 10/1988 | Yamada et al. | 417/410.2 |
| 5,008,582 A | * | 4/1991 | Tanuma et al. | 310/332 |
| 5,335,143 A | * | 8/1994 | Maling et al. | 361/694 |
| 5,861,703 A | * | 1/1999 | Losinski | 310/330 |
| 7,061,161 B2 | * | 6/2006 | Scher et al. | 310/328 |
| 2004/0190305 A1 | * | 9/2004 | Arik et al. | 362/555 |
| 2004/0253130 A1 | * | 12/2004 | Sauciuc et al. | 417/436 |

FOREIGN PATENT DOCUMENTS

| | | | |
|---|---|---|---|
| JP | 58-139482 | * | 8/1983 |
| JP | 01-233796 | * | 9/1989 |
| JP | 4-65864 | * | 3/1992 |
| JP | 04065864 | * | 3/1992 |
| JP | 8-330488 | * | 12/1996 |
| JP | 10-056215 | * | 2/1998 |

* cited by examiner

*Primary Examiner*—Thomas M. Dougherty
(74) *Attorney, Agent, or Firm*—Buckley, Maschoff & Talwalkar LLC (57) ABSTRACT

In some embodiments, a piezoelectric actuator is coupled to a blade having a rake shape. The blade may include a base with two or more prongs extending therefrom. At least a portion of one or more prongs may be positioned between the fins of a heat sink. Other embodiments are disclosed and claimed.

3 Claims, 6 Drawing Sheets

RAKE SHAPED FAN

The invention relates to a rake shaped fan for air flow applications. More particularly, some embodiments of the invention relate to a piezoelectric actuated rake shaped fan for thermal management applications.

BACKGROUND AND RELATED ART

Piezoelectric actuators are well known. A piezoelectric fan for an integrated circuit chip is described in co-pending patent application Ser. No. 11/024,297, filed Dec. 24, 2004. A piezo actuator for cooling is described in co-pending patent application Ser. No. 11/173,903, filed Jun. 30, 2005.

BRIEF DESCRIPTION OF THE DRAWINGS

Various features of the invention will be apparent from the following description of preferred embodiments as illustrated in the accompanying drawings, in which like reference numerals generally refer to the same parts throughout the drawings. The drawings are not necessarily to scale, the emphasis instead being placed upon illustrating the principles of the invention.

DESCRIPTION

In the following description, for purposes of explanation and not limitation, specific details are set forth such as particular structures, architectures, interfaces, techniques, etc. in order to provide a thorough understanding of the various aspects of the invention. However, it will be apparent to those skilled in the art having the benefit of the present disclosure that the various aspects of the invention may be practiced in other examples that depart from these specific details. In certain instances, descriptions of well known devices, circuits, and methods are omitted so as not to obscure the description of the present invention with unnecessary detail.

Figure 1:
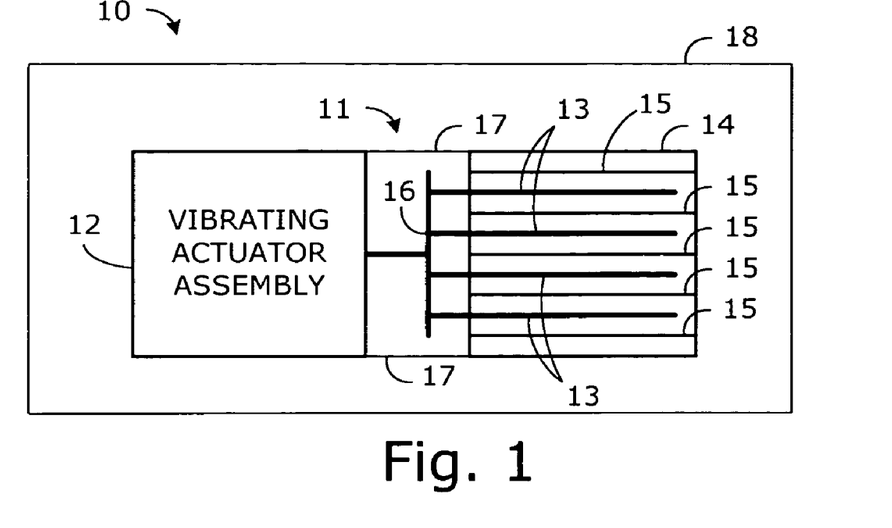
FIG. 1 is a block diagram top view of a system utilizing a rake shaped fan according to some embodiments of the invention.

With reference to FIG. 1, an electronic system 10 includes a cooling device 11 having an actuator assembly 12 configured to vibrate when powered, a plurality of prongs 13 coupled to the actuator assembly 12, and a heat sink 14 having two or more protruding fins 15, wherein at least a portion of one or more prongs 13 is positioned between the fins 15 of the heat sink 14. For example, the actuator assembly 12 may include one or more piezoelectric actuators. Alternatively, the actuator assembly may include motorized, mechanical, or other conventional or hereinafter discovered vibrating actuators. For example, the prongs 13 may extend from a base portion 16 and may lie or substantially lie in a same plane (e.g. the plane of the drawing sheet). For example, the actuator assembly 12 may be attached to the heat sink 14 (e.g. by supports 17). For example, the heat sink 14 may be attached or supported by a system board 18.

In some embodiments, a substantial portion of the prongs 13 overlaps with a portion of the fins 15. For example, in some embodiments at least 5% of the length of the prongs 13 overlaps with a portion of the fins 15. In some embodiments, almost 100% of the length of the prongs 13 may overlap with a portion of the fins 15. In most embodiments, between 10% and 90% of the length of the prongs 13 may overlap with a portion of the fins 15. In some embodiments, at least 50% of the length of the prongs 13 overlaps with a portion of the fins 15. Advantageously, in some embodiments, relatively more overlap may provide an improvement in cooling characteristics.

Figure 2:
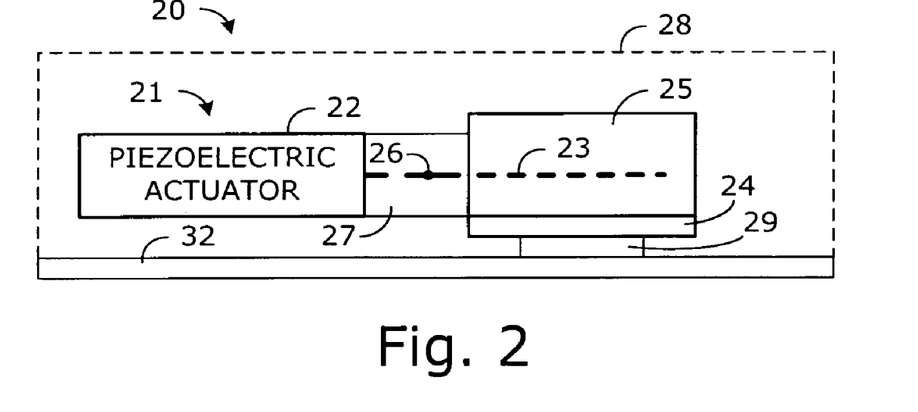
FIG. 2 is a block diagram side view of another system utilizing a rake shaped fan according to some embodiments of the invention.

With reference to FIG. 2, another electronic system 20 includes an enclosure 28, an electronic component 29 inside the enclosure 28, a heat dissipating element 24 (e.g. a heat sink) thermally coupled to the electronic component 29, and a piezoelectric fan 21 (e.g. including a piezoelectric actuator 22) positioned near the heat dissipating element 24, the piezoelectric fan 21 including two or more prongs 23 positioned in or substantially in a same plane (e.g. a plane perpendicular to the drawing sheet). For example, the prongs 23 may extend from a base portion 26. For example, the heat dissipating element 24 may include two or more protruding fins 25, and at least a portion of the two or more prongs 23 may be positioned between the fins 25 of the heat dissipating element 24. For example, the piezoelectric fan 21 may be attached to the heat dissipating element 24 (e.g. by supports 27). For example, the electronic component 29 may be mounted on a printed circuit board 32.

Figure 3:
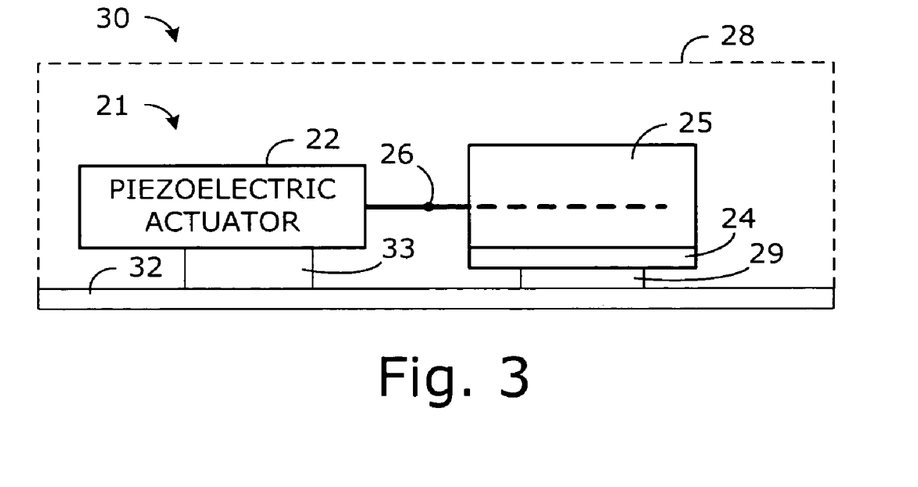
FIG. 3 is a block diagram side view of another system utilizing a rake shaped fan according to some embodiments of the invention.

With reference to FIG. 3, like numbered reference numerals refer to similar components as described above in connection with FIG. 2. In FIG. 3, an electronic system 30 is similar to the system 20, but the piezoelectric fan 21 may be supported separately from the heat dissipating element 24. For example, the piezoelectric fan 21 may be supported by the printed circuit board 32. In some applications, a spacer 33 or other mounting hardware may be positioned between the piezoelectric fan 21 and the printed circuit board 32. For example, the spacer 33 may position the piezoelectric fan 21 at a desired height and angle with respect to the heat dissipating element 24.

Figure 4:
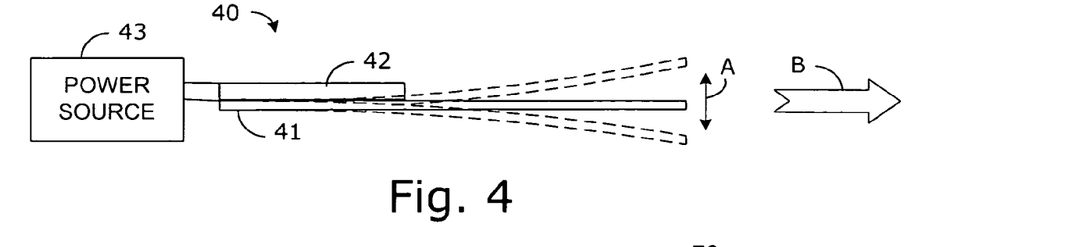
FIG. 4 is a block diagram side view of a rake shaped fan according to some embodiments of the invention.

With reference to FIG. 4, a piezoelectric fan 40 may include a blade 41 having two or more prongs made from a suitable material. The blade material may be, for example, a flexible, non-conducting material such as Mylar®. A piezoelectric portion 42 may be attached to one end of the blade 41 with the rest of the blade being suspended in free space, similar to a cantilever beam. The piezoelectric portion 42 may include, for example, a ceramic material that expands or contracts in response to an electric current. A power source 43 may provide power to the piezoelectric portion 42. When an electric current flows through the piezoelectric portion 42 in one direction, the piezoelectric portion 42 may contract causing the blade to flex upward. Similarly, when an electrical current flows through the piezoelectric portion 42 in the opposite direction, the piezoelectric portion 42 may expand causing the blade to flex downward. Thus, when alternating current (AC) power is provided to the piezoelectric fan 40 at an appropriate frequency (e.g. substantially near a resonant frequency) the blade 41 may oscillate or vibrate (e.g. in the direction of arrow A). The appropriate frequency may depend on, for example, the sizes, materials, and proportions associated with the blade. The vibration of the blade 41 may generate an air flow (e.g. predominantly in the direction of arrow B).

Figure 5:
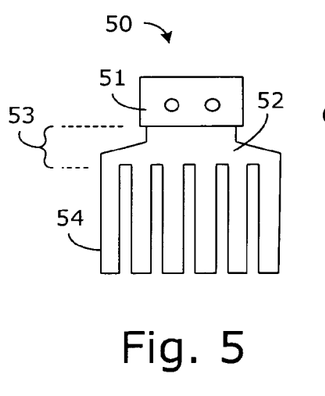
FIG. 5 is a front view of another rake shaped fan according to some embodiments of the invention.

With reference to FIG. 5, a piezoelectric fan 50 includes a single piezoelectric actuator 51 and a blade 52 having a rake shape coupled to the actuator 51. For example, the blade 52 may include a base portion 53 with two or more flat prongs 54 extending therefrom. Although described herein primarily in connection with thermal management of electronic components, rake shaped fans according to some embodiments of the invention may find utility in other air flow applications. For example, a rake shaped fan may be useful for creating air flow in a plug-in air freshener, particularly where the air freshener material may be grooved and the prongs of the rake shaped fan are positioned in the grooves.

Figure 6:
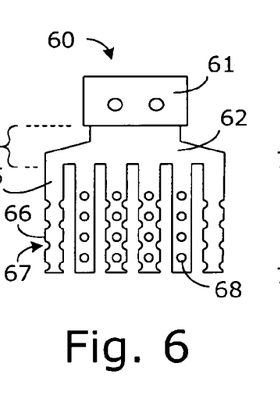
FIG. 6 is a front view of another rake shaped fan according to some embodiments of the invention.

With reference to FIG. 6, a piezoelectric fan 60 includes a single piezoelectric actuator 61 and a blade 62 having a rake shape coupled to the actuator 61. For example, the blade 62 may include a base portion 63 with two or more flat prongs 65 extending therefrom. In some examples, at least one prong 65 includes an edge 66 having one or more serrations or notches 67 along the edge. In some examples, at least one prong 65 includes a hole 68 through the prong 65. In some examples, the prongs 65 may include various combinations of notches 67 and holes 68. In some applications, all of the prongs 65 may include only notches or only holes. In some embodiments, the notches 67 may have a saw tooth or other serrated shape. Although illustrated as round, in some embodiments the holes 68 may be rectangular or other shapes.

Figure 7:
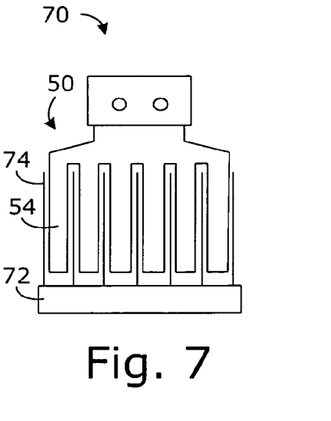
FIG. 7 is a front view of a system utilizing the rake shaped fan from FIG. 5.

With reference to FIG. 7, a cooling device 70 includes the piezoelectric fan 50 and further includes a heat sink 72 having a plurality of protruding fins 74, wherein at least a portion of one or more prongs 54 is positioned between the fins 74 of the heat sink 72. As illustrated, the prongs 54 are interwoven between respective fins 74 of the heat sink 72, with more than majority of the length of the prongs 54 overlapping with a portion of the fins 74.

Figure 8:
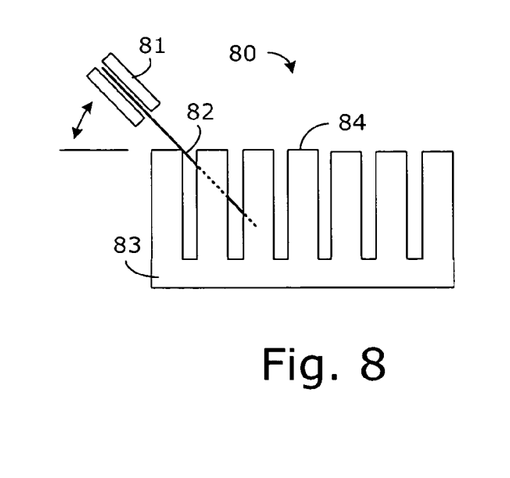
FIG. 8 is a side view of another system utilizing a rake shaped fan according to some embodiments of the invention.

With reference to FIG. 8, a cooling device 80 includes an actuator assembly 81 configured to vibrate when powered, a plurality of prongs 82 coupled to the actuator assembly 81, and a heat sink 83 having two or more protruding fins 84, wherein at least a portion of one or more prongs 82 is positioned between the fins 84 of the heat sink 83. The heat sink 83 may be a pin type heat sink with an array of protruding cylindrical fins 84 defining air flow channels in two directions. The prongs 82 may be angled with respect to the heat sink 83. For example, a substantially common plane of the prongs 82 may be transverse to a plane of the base of the heat sink 83.

Figure 9:
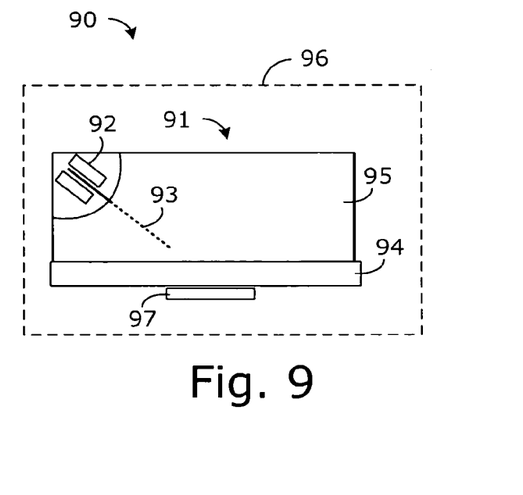
FIG. 9 is a side view of another system utilizing a rake shaped fan according to some embodiments of the invention.

With reference to FIG. 9, an electronic system 90 includes a cooling device 91 having an actuator assembly 92 configured to vibrate when powered, a plurality of prongs 93 coupled to the actuator assembly 92, and a heat sink 94 having two or more protruding fins 95, wherein at least a portion of one or more prongs 93 is positioned between the fins 95 of the heat sink 94. For example, the actuator assembly 92 may be attached to the heat sink 94. For example, the actuator assembly 92 may be contained within a volume defined by the heat sink 94 (e.g. the volume defined by the outermost dimensions of the heat sink 94). For example, two outermost fins of the heat sink 94 may extend beyond the inner fins. For example, as illustrated a portion of each of the inner fins is notched or cut away to provide space for the actuator. The actuator may then be mounted between the two outermost fins. In some applications, a single fin of the heat sink 94 may provide the sole mounting support for the actuator.

In some applications, the actuator assembly and prongs may be implemented by a piezoelectric fan. For example, the system 90 may further include an enclosure 96 with an electronic component 97 inside the enclosure 96. The heat sink 94 may be thermally coupled to the electronic component 97 and the piezoelectric fan may be positioned near the heat sink 94. For example, the piezoelectric fan may include two or more prongs 93 positioned in a same plane. For example, the piezoelectric fan may be attached to the heat sink 94. As illustrated in FIG. 9, the piezoelectric fan is contained within a volume defined by the heat sink 94. Advantageously, the rake shaped piezoelectric fan may be positioned at or near a specific target area of the base plate of the heat sink 94. The rake shaped piezoelectric fan may be encased within the heat-sink form factor and oriented at any desired angle with respect to, for example, either the gravity vector or the direction of a prevailing coolant flow (e.g. to supplement the air flow and/or break the boundary layer to improve cooling).

For example, some embodiments of a rake shaped fan according to the invention may be useful for low flow or otherwise passive heat sink applications. Rake shaped fans according to some embodiments of the invention may find utility in various handheld products, consumer electronics products, low power micro-processor applications, chipset cooling, and low-velocity turbulent flow applications.

When the rake shaped fan is powered, the vibration of the prongs may generate an air flow. In some embodiments, the air flow generated by the vibration of the prongs may impinge towards the base plate of the heat sink or fins. For example, this impinging air flow may generate a local turbulent flow from within the thermo-mechanical boundary layers at the fin surfaces. Advantageously, an undulating turbulent flow may break the boundary layers. A portion of the generated air flow may also mix through the fin channels in a direction perpendicular to the predominant flow direction (e.g. in a direction from the fin base to the fin tips). Advantageously, the perpendicular air flow may lower the effective cooling air temperature of the heat sink by entraining the cooler tip air towards the hotter base plate. The position and impinging angle may be chosen as desired depending on system design specifications as well as the direction of the gravity for enhancement of the convection performance at the target surface.

Advantageously, some rake shaped fans according to the invention may allow the actuator to be infiltrated into the form factor of the heat sink as the prongs of the actuator may be interwoven with the fins of the heat sink (e.g. see FIG. 7). An advantage of some embodiments is that the interwoven prongs may provide the air flow closer to and/or directly over the base plate of the heat sink, hence removing heat more effectively. In addition, in some embodiments the convection heat transfer from the fin surfaces may be significantly improved. For example, in some embodiments an undulating air pattern generated within the near-field of the actuator prongs may break the boundary layer that may be built up right at the surface of the fins. In some embodiments, the rake shaped fan may be utilized in conjunction with active cooling air, where the rake shaped fan may break up the boundary layer and thereby improve cooling from the active cooling air.

Advantageously, rake shape fans according to some embodiments of then invention may be provided in many shapes, sizes, and form factors. Very small piezoelectric actuators may be utilized in a cooling device for handheld products such as cellular telephones and personal digital assistants (PDAs). Larger piezoelectric actuators may be utilized in larger devices such as laptop computers or set top boxes, such as digital media centers or hard disk recorders. Advantageously, rake shaped fans according to some embodiments of the invention may provide quieter operation than conventional spinning fans. In some embodiments, a rake shaped fan may cost less to manufacture in high volume than a conventional spinning fan.

Figure 10:
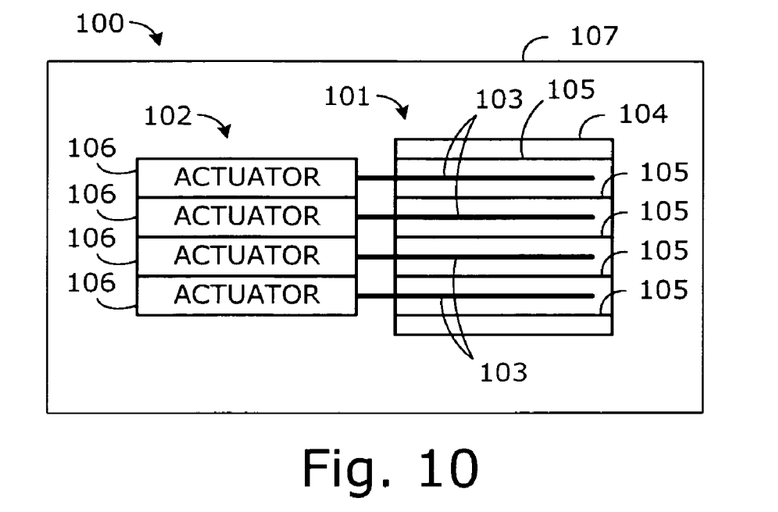
FIG. 10 is a block diagram top view of another system utilizing a rake shaped fan according to some embodiments of the invention.

With reference to FIG. 10, an electronic system 100 includes a cooling device 101 having an actuator assembly 102 configured to vibrate when powered, a plurality of prongs 103 coupled to the actuator assembly 102, and a heat sink 104 having two or more protruding fins 105, wherein at least a portion of one or more prongs 103 is positioned between the fins 105 of the heat sink 104. For example, the actuator assembly 102 may include a plurality of piezoelectric actuators 106. For example, each of the plurality of prongs 103 may be coupled to a respective one of the plurality of piezoelectric actuators 106. For example, the prongs 103 may lie or substantially lie in a same plane (e.g. the plane of the drawing sheet). For example, the actuator assembly 102 may be attached to the heat sink 104 or may be supported by a printed circuit board 107.

Figure 11:
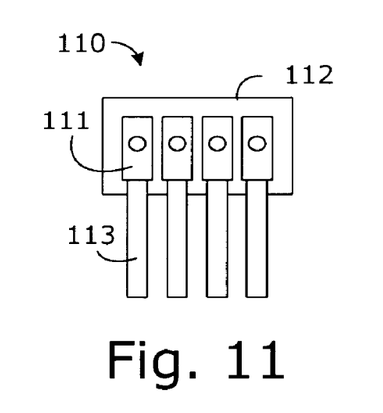
FIG. 11 is a front view of another rake shaped fan according to some embodiments of the invention.

With reference to FIG. 11, a rake shaped fan 110 includes a plurality of (e.g. four) piezoelectric actuators 111 mounted on a substrate 112. For example, the substrate 112 may include a printed circuit board having circuit traces for power, ground, and other signals for operation of the plurality of actuators 111. In some applications, the substrate 112 may carry other components as well. The rake shaped fan further includes a plurality of prongs 113 with each prong coupled to a respective one of the plurality of actuators 111. As illustrated, each of the prongs 113 is a flat blade which lies in the same or substantially the same plane with each of the other prongs 113.

Figure 12:
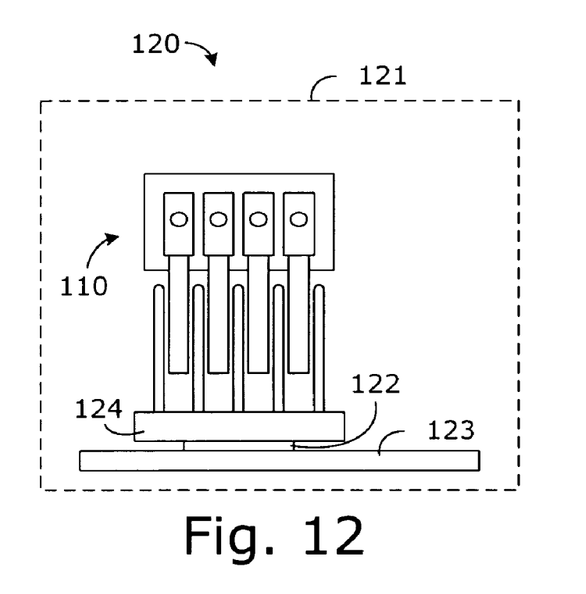
FIG. 12 is a front view of a system utilizing the rake shaped fan from FIG. 11

With reference to FIG. 12, an electronic system 120 includes an enclosure 121 and an electronic component 122 inside the enclosure 121. For example, the electronic component 122 may be mounted on a printed circuit board 123. The system 120 further includes a heat dissipating element 124 thermally coupled to the electronic component 122 and the piezoelectric fan 110 positioned near the heat dissipating element 124, the piezoelectric fan 110 including two or more prongs positioned in a same plane.

Figure 13:
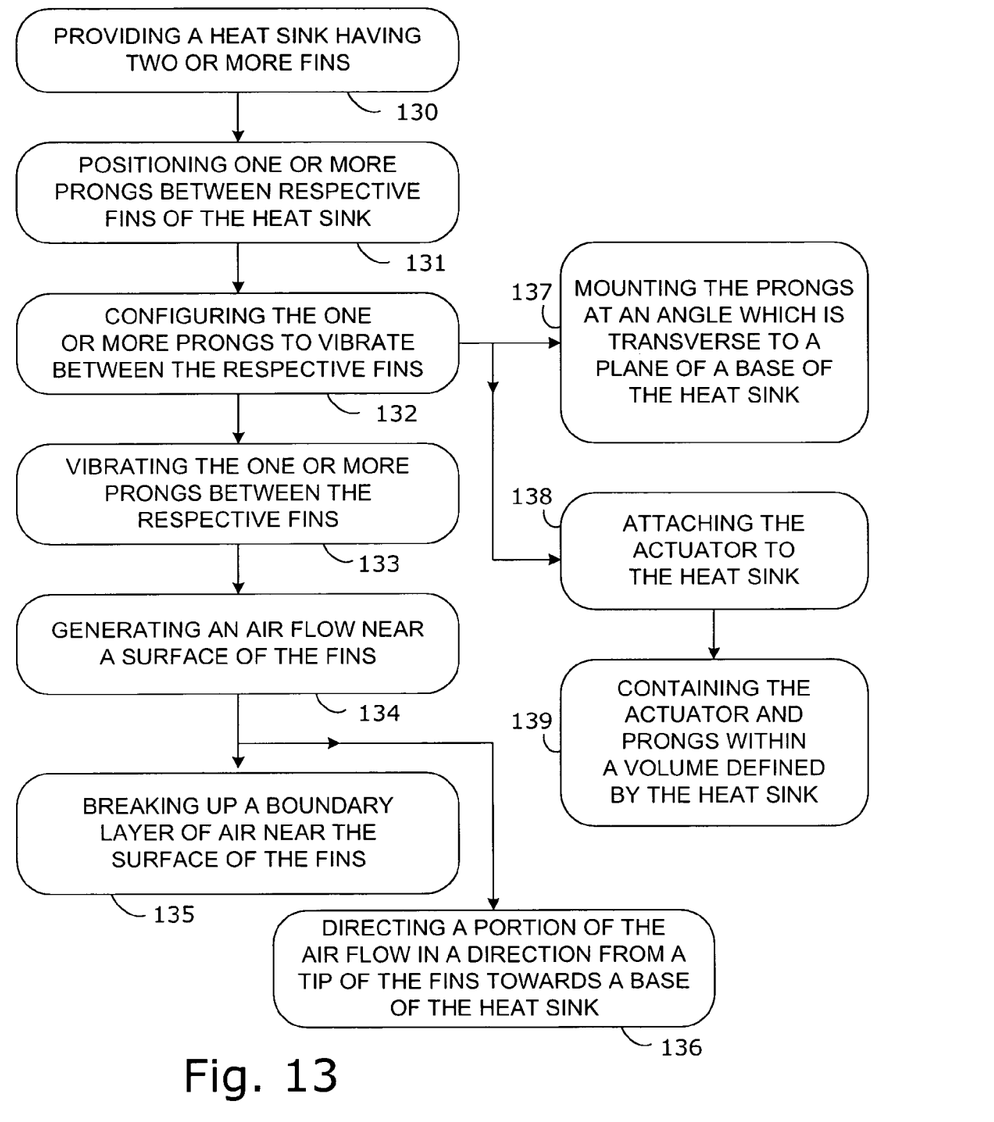
FIG. 13 is a flow diagram according to some embodiments of the invention.

With reference to FIG. 13, some embodiments of the invention involve providing a heat sink having two or more fins (e.g. at block 130), positioning one or more prongs between respective fins of the heat sink (e.g. at block 131), and configuring the one or more prongs to vibrate between the respective fins (e.g. at block 132). For example, some embodiments of the invention may further involve vibrating the one or more prongs between the respective fins (e.g. at block 133).

Other aspects of some embodiments of the invention may involve generating an air flow near a surface of the fins (e.g. at block 134). For example, some embodiments of the invention may further involve breaking up a boundary layer of air near the surface of the fins (e.g. at block 135) and/or directing a portion of the air flow in a direction from a tip of the fins towards a base of the heat sink (e.g. at block 136).

Another aspect of some embodiments of the invention may involve mounting the one or more prongs at an angle which is transverse to a plane of a base of the heat sink (e.g. at block 137). In some embodiments of the invention one or more prongs are coupled to an actuator and a further aspect may involve attaching the actuator to the heat sink (e.g. at block 138). For example, some embodiments may further involve containing the actuator and the one or more prongs within a volume defined by the heat sink (e.g. at block 139).

An example cooling device was constructed as follows. A heat sink was constructed of extruded aluminum with overall exterior dimensions of about 63 mm by 63 mm by 42 mm. The base plate portion was about 10 mm thick. The heat sink included nine (9) protruding parallel fins having dimensions of about 32 mm high by 63 mm long by 1.2 mm thick. The fins were evenly spaced on about a 7 mm pitch. A 1 mm wide by 1 mm deep groove was cut in the base plate on the side opposite of the fins to accommodate a thermocouple for test purposes.

A rake shaped piezoelectric fan assembly was constructed as follows. A flat blade constructed of polymers was glued to a piezoelectric actuator to form an individual piezoelectric fan. The overall dimensions of the piezoelectric fan were approximately 3 mm wide by 70 mm long with the blades having a thickness of about 0.1 mm. Roughly 40 mm of flexible blade material protruded from the actuator. A comparable piezoelectric fan assembly may be commercially obtained from various manufacturers. The rake shaped assembly included seven (7) such piezoelectric fans mounted side by side and evenly spaced on a metal plate such that the respective blades were substantially parallel and co-planar. The pitch of the actuators was roughly 7 mm, corresponding to the pitch of the heat sink fins. Power was separately provided by wires from an AC source to each to actuator. The AC source was configured to provide an alternating current of about 110 volts at a frequency of about 40.8 Hz.

Two support arms were constructed from metal, roughly 58 mm long with holes at each end to accept a mounting bolt. A support arm was bolted at one end to each side of the heat sink, parallel to the fins. The blades of the actuator assembly were positioned between the fins of the heat sink and the metal plate of the actuator assembly was secured with bolts between the other ends of the support arms. The angle of the support arm was adjustable to any angle between parallel and perpendicular to the base plate of the heat sink by loosening the bolts, adjusting the angle of the arms, and re-tightening the bolts. An example angle utilized for the arms was between 30 and 60 degrees from the plane of the base plate of the heat sink. Likewise the angle of the actuator and prongs was adjustable to any angle between parallel and perpendicular to the base plate of the heat sink by loosening the bolts, adjusting the angle of the metal plate of the actuator assembly, and re-tightening the bolts. An example angle utilized for the prongs was between 30 and 60 degrees from the plane of the base plate of the heat sink. Depending on the position of the arms and the actuator assembly, the blades could overlap with the fins of the heat sink for a length of between roughly 20% and 80% of the length of the blades.

A comparison test was performed as follows. The cooling device as described above was constructed with the prongs at angle of about 30 degrees relative to the base plate of the heat sink. The prongs extended into the heat sink for length of roughly 15 mm (e.g. roughly 37% of the length of the blade overlapped with the fins of the heat sink). An AC source powered the actuators at 110 volts with a cycle of roughly 40.8 Hz, which produced a vibration of the actuators and an oscillation of the prongs, thereby generating an air flow. The cooling device was thermally coupled to a thermal sensor and measurements were taken with and without the rake shaped fan in operation.

Preliminary tests show more than a 50% improvement in the heat sink resistance over natural convection for a particular different set of boundary conditions. Namely, a pair of piezo fans, model no. RFN1-005 made by Piezo Systems, Inc., were installed in the front of a heat sink with the blades substantially parallel and co-planar with respect to each other. Measurements were taken under natural convection conditions and also with the fans operating. It is believed that even further improvement would be obtained with piezo fan blades interwoven with the fins of the heat sink.

Without being limited to theory of operation, the air flow generated by a rake shaped fan may impinge on the base plate of the heat sink within a closer proximity and directly toward the surface of the base plate or fins. While the undulating turbulent flow may break the boundary layers, it may also mix the air flow through the fin-channels in perpendicular to the flow direction (i.e. from the fin base to the fin tips), literally lowering the effective cooling air temperature of the heat sink by entraining the cooler tip air towards the hotter base plate. In addition, the rake shaped fan may generate a local turbulent flow from within the thermo-mechanical boundary layers at the fin surfaces.

Figures 14, 15:
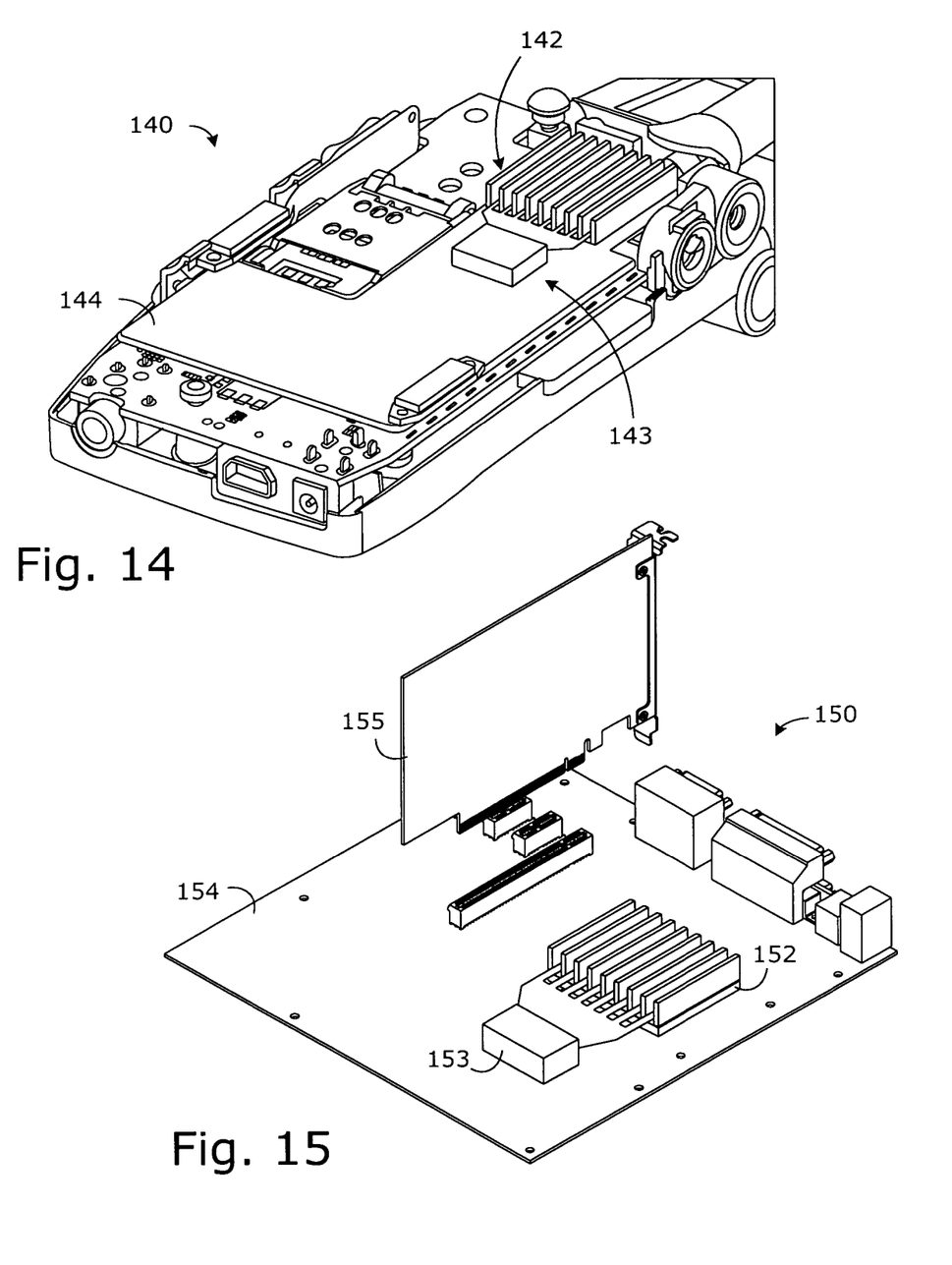
FIG. 14 is a perspective view of another system utilizing a rake shaped fan according to some embodiments of the invention.
FIG. 15 is a perspective view of another system utilizing a rake shaped fan according to some embodiments of the invention.

With reference to FIG. 14, a handheld device 140 includes an enclosure 141 (partially shown), an electronic component inside the enclosure (not shown, e.g. a processor positioned under the heat sink 142), a heat sink 142 thermally coupled to the electronic component, and a piezoelectric fan 143 positioned near the heat sink 142, the piezoelectric fan 143 including two or more prongs positioned in a same plane. The piezoelectric fan is mounted on a printed circuit board 144. The piezoelectric fan 143 includes a blade having a base portion with the two or more prongs extending therefrom. The heat sink 142 includes two or more protruding fins. Each of the prongs 144 is positioned between respective fins of the heat sink 142. For example, the device 140 may be a cell phone, a PDA, a video game, a personal media device, or other type of handheld consumer electronics product.

With reference to FIG. 15, an electronic device 150 includes an enclosure (not shown), an electronic component inside the enclosure (not shown, e.g. one or more chips in a chipset positioned under the heat sink 152), a heat sink 152 thermally coupled to the electronic component, and a piezoelectric fan 153 positioned near the heat dissipating element, the piezoelectric fan 163 including two or more prongs positioned in a same plane. The piezoelectric fan is mounted on a system board 154 (e.g. a motherboard). The piezoelectric fan 153 includes a blade having a base portion with the two or more prongs extending therefrom. The heat sink 152 includes two or more protruding fins. Each of the prongs is positioned between respective fins of the heat sink 152. For example, the device 150 may be a personal computer (PC), a set top box (e.g. a media center), a video game console, or other type of consumer electronics product. In some embodiments, the device 150 may be configured to accept one or more plug-in cards 155.

Figure 16:
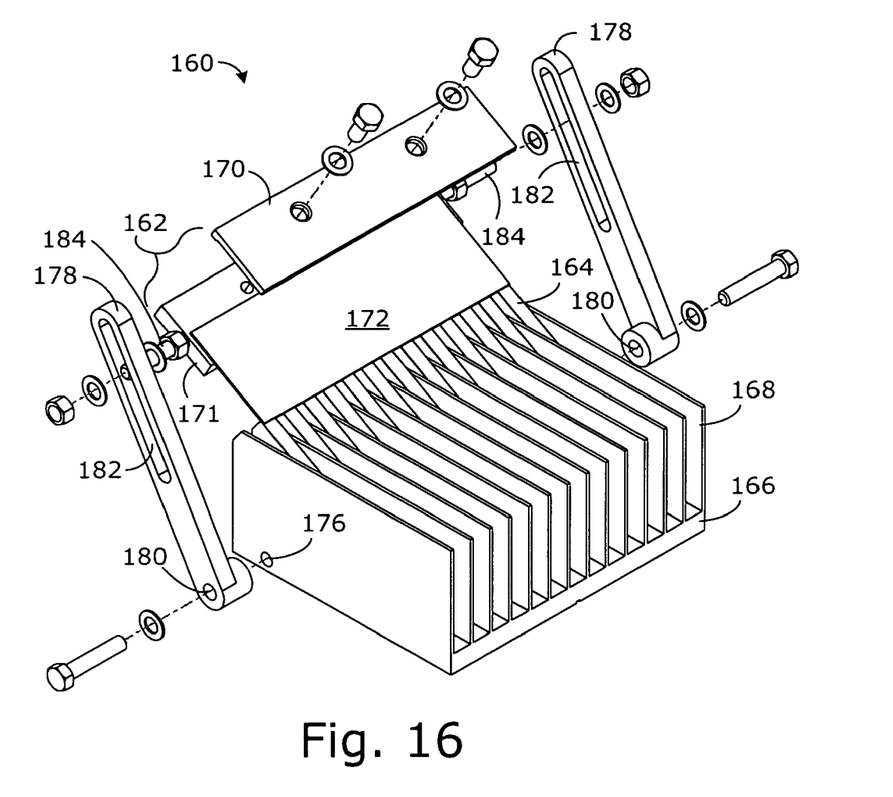
FIG. 16 is an exploded, perspective view of another system utilizing a rake shaped fan according to some embodiments of the invention.
Figure 17:
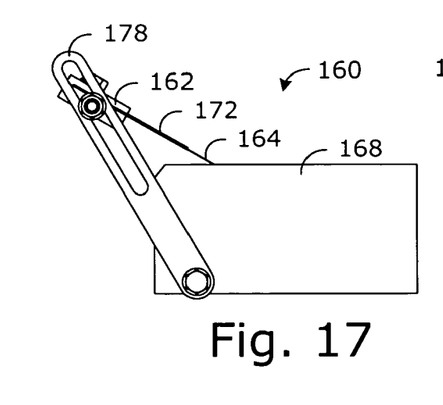
FIG. 17 is a side view of the system from FIG. 16.
Figure 18:
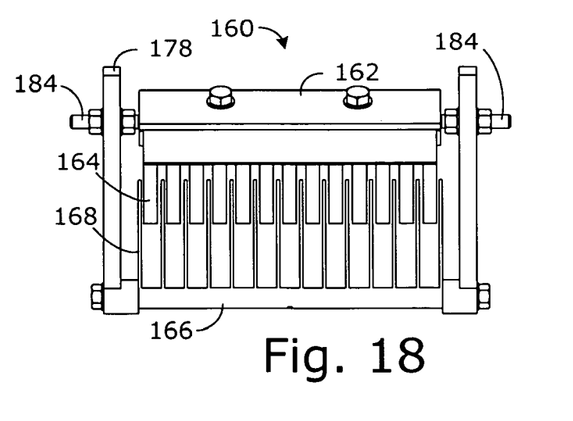
FIG. 18 is a front view of the system from FIG. 16.

With reference to FIGS. 16-18, another cooling device 160 according to some embodiments of the invention includes an actuator assembly 162 configured to vibrate when powered, a plurality of prongs 164 coupled to the actuator assembly 162, and a heat sink 166 having two or more protruding fins 168, wherein at least a portion of one or more prongs 164 is positioned between the fins 168 of the heat sink 166. The actuator assembly 162 may include a single piezoelectric actuator 170. A blade 172 having a rake shape may be coupled to the single piezoelectric actuator 170. For example, the plurality of prongs 164 may include flat prongs 164 extending from a base portion of the blade 172 having the rake shape. As illustrated, the actuator assembly 162 is attached to the heat sink 166.

For example, the cooling device 160 may be constructed as follows. The piezoelectric actuator 170 may be made from ceramic material. The blade 172 may be made from Mylar® and positioned between the piezoelectric actuator 170 and a metal plate 171 of the actuator assembly 162. The actuator 170 may be secured to the metal plate 171 with two bolts, thereby securing the blade 172 in place. The heat sink 166 may be made from extruded aluminum and machined to have threaded holes 176 on opposite sides of the base plate of the heat sink 166. Two elongated support arms 178 may be machined or otherwise formed with a hole 180 at one end and a slot 182 at the other end. Threaded rods 184 are attached to opposite ends of the actuator assembly 162. The threaded rods 184 are positioned in the slots 182 of the support arms 178 and may be secured in a desired position with bolts, washers, and/or other mounting hardware. The support arms 178 may be secured to the heat sink 166 with bolts through the holes 180 in the support arms 178 and threaded into the holes 176 in the heat sink 166 (together with appropriate washers, and/or other mounting hardware).

Advantageously, the support arms 178 and actuator assembly 162 can be positioned and secured at any angle between parallel and perpendicular with respect to the base plate of the heat sink 166. Advantageously, the slot 182 allows the actuator assembly 162 to be adjustably positioned at a desired distance from the fins 168 of the heat sink 166.

The foregoing and other aspects of the invention are achieved individually and in combination. The invention should not be construed as requiring two or more of such aspects unless expressly required by a particular claim. Moreover, while the invention has been described in connection with what is presently considered to be the preferred examples, it is to be understood that the invention is not limited to the disclosed examples, but on the contrary, is intended to cover various modifications and equivalent arrangements included within the spirit and the scope of the invention.

What is claimed is:

1. An apparatus, comprising:
    a single piezoelectric actuator;
    a blade having a rake shape coupled to the actuator and including a base portion with flat prongs extending therefrom in a same plane; and
    a heat sink having a base and a plurality of protruding fins,
    wherein at least a portion of the flat prongs is positioned between the fins of the heat sink at an angle that is transverse to a plane of the base of the heat sink.

2. The apparatus of claim 1, wherein at least one prong includes an edge having one or more notches along the edge.

3. The apparatus of claim 1, wherein at least one prong includes a hole through the prong.

* * * * *